(12) United States Patent
Zhang et al.

(10) Patent No.: US 11,569,274 B2
(45) Date of Patent: Jan. 31, 2023

(54) ARRAY SUBSTRATE, DISPLAY DEVICE AND METHOD OF FORMING ARRAY SUBSTRATE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Taoran Zhang, Beijing (CN); Da Zhou, Beijing (CN); Zailong Mo, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 513 days.

(21) Appl. No.: 16/491,737

(22) PCT Filed: Jan. 31, 2019

(86) PCT No.: PCT/CN2019/074200
§ 371 (c)(1),
(2) Date: Sep. 6, 2019

(87) PCT Pub. No.: WO2019/227964
PCT Pub. Date: Dec. 5, 2019

(65) Prior Publication Data
US 2021/0358979 A1 Nov. 18, 2021

(30) Foreign Application Priority Data
May 31, 2018 (CN) .......................... 201820843207.9

(51) Int. Cl.
*H01L 27/12* (2006.01)
*H01L 27/32* (2006.01)

(52) U.S. Cl.
CPC ........ H01L 27/1259 (2013.01); H01L 27/124 (2013.01); H01L 27/3276 (2013.01)

(58) Field of Classification Search
CPC ........... H01L 29/66969; H01L 27/1225; H01L 29/4908; H01L 29/7869; H01L 29/78696
See application file for complete search history.

(56) References Cited

U.S. PATENT DOCUMENTS

| 9,767,727 | B2 | 9/2017 | Byun et al. | |
| 2017/0263880 | A1* | 9/2017 | Lee | H01L 51/52 |
| 2019/0245028 | A1* | 8/2019 | Lee | H01L 27/3276 |
| 2021/0175463 | A1* | 6/2021 | Zhou | G02F 1/1339 |

FOREIGN PATENT DOCUMENTS

CN 208422960 U 1/2019

* cited by examiner

*Primary Examiner* — Tony Tran
(74) *Attorney, Agent, or Firm* — Dilworth & Barrese, LLP.; Michael J. Musella, Esq.

(57) ABSTRACT

An array substrate includes a base substrate, a display region formed on the base substrate, and a non-display region formed on the base substrate around the display region. The non-display region includes a detection line that is provided on the base substrate, and a surface of the detection line away from the base substrate is provided in an undulating shape. A display device is further disclosed.

5 Claims, 4 Drawing Sheets

ARRAY SUBSTRATE, DISPLAY DEVICE AND METHOD OF FORMING ARRAY SUBSTRATE

The application claims priority to Chinese patent application No. 201820843207.9, filed May 31, 2018, the entire disclosure of which is incorporated herein by reference as part of the present application.

TECHNICAL FIELD

Embodiments of the present disclosure relate to an array substrate, a display device and a method of forming the array substrate.

BACKGROUND

A flexible organic light-emitting diode product is generally packaged by a flexible encapsulation. If the flexible encapsulation suffers from air leakage, an electroluminescent device will be exposed to external water vapor, so that electroluminescent material in the electroluminescent device may fail due to contact with water, resulting in growing dark spot (GDS) in a display screen.

A basic reason of air leakage of the flexible encapsulation involves cracks of a film layer. The cracks of the film layer further cause rupture of the thin film encapsulation (TFE). In order to improve the yield of OLED product, the cracks of the film layer are needed to be detected as early as possible.

SUMMARY

At least one of embodiments of the present disclosure provides an array substrate, which includes a base substrate, a display region formed on the base substrate, and a non-display region formed on the base substrate around the display region. The non-display region includes a detection line that is provided on the base substrate, and a surface of the detection line away from the base substrate is provided in an undulating shape.

In an embodiment of the present disclosure, the non-display region further includes an adjustment layer; the adjustment layer is provided on the base substrate, and the adjustment layer is formed by a same patterning process as an active layer in the display region; the detection line is provided on the adjustment layer; a surface of the adjustment layer away from the base substrate is provided in the undulating shape, and a surface of the detection line away from the base substrate and a surface of the detection line close to the base substrate are both provided in undulating shapes.

In an embodiment of the present disclosure, the non-display region further includes a first buffer layer; the first buffer layer is provided between the adjustment layer and the base substrate, and the first buffer layer is formed by a same patterning process as a second buffer layer in the display region.

In an embodiment of the present disclosure, the detection line is formed by a same patterning process as a gate electrode layer in the display region.

In an embodiment of the present disclosure, the detection line is formed by a same patterning process as a pixel electrode layer in the display region.

In an embodiment of the present disclosure, the array substrate further includes a fan-out region. The fan-out region includes the base substrate, a first buffer layer, an adjustment layer and the detection line; the first buffer layer is provided on the base substrate, the adjustment layer is provided on the first buffer layer, and the surface of the adjustment layer away from the base substrate is provided in the undulating shape, the surface of the detection line away from the base substrate and the surface of the detection line close to the base substrate are both in the undulating shape.

In an embodiment of the present disclosure, the undulating shape is a wave shape.

In an embodiment of the present disclosure, the detection line is made of metal molybdenum.

At least one of embodiments of the present disclosure provides a display device, which includes the array substrate provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

At present, a flexible organic light-emitting diode product is generally packaged by a flexible encapsulation. If the flexible encapsulation losses air tightness, water vapor may enter an electroluminescent device, so that electroluminescent material fails, resulting in growing dark spot in a display screen. In order to improve the yield of OLED product, cracks of a film layer are needed to be detected as early as possible.

In practical applications, if a crack of a TFE thin film is not obvious caused by a slight crack of a film layer, an eddy current testing (ET) method among the technologies known to inventors cannot detect the crack of the of the TFE thin film, and obvious defects will not appear in a subsequent lighting phase. Under this condition, in a high-temperature reliability test of the OLED product or in a subsequent usage of the OLED product, the crack of the film layer will become more serious, which may cause an array substrate to be defective, so that the array substrate has a risk of scrapping.

A technology known to the inventors provides a detection method, which is called as a Panel Crack Detect (PCD) routing detection method. Following is a brief description of the PCD routing detection method.

Figure 1:
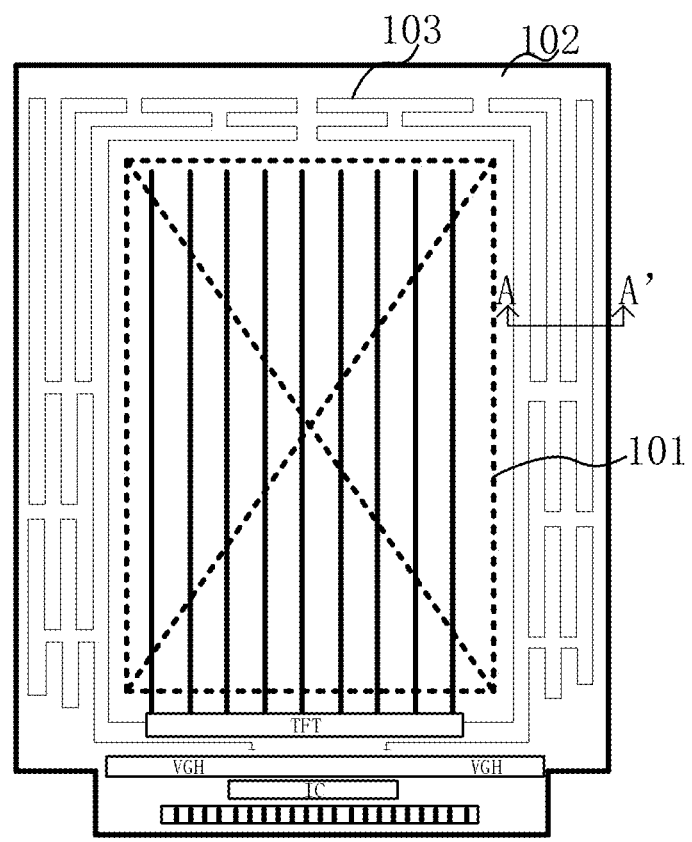
FIG. 1 is a schematic diagram of a detection line routing in a non-display region in technology known to inventors.

Referring to FIG. 1, an array substrate known to the inventors includes at least a display region 101 (further referred to as an AA region) and a non-display region 102 (further referred to as a non-AA region, which is a region between a thick dashed line and a thick solid line) around the display region. In the embodiment, a detection line 103 is provided in the non-display region 102 and is connected with a data line in the display region. A detection principle of the PCD routing detection method is as follows.

A preset pixel voltage is written to the data line by the detection line. If the detection line is in a good condition, pixels in a corresponding column display a preset color, such as green. If the detection line is broken or has cracks, the resistance of the detection line increase, and the series resistance of the detection line and the data line becomes great. According to a principle of resistance division, the pixel voltage written to the pixels in the corresponding column becomes smaller, so that the pixels in the corresponding column no longer display the preset color, such as purple. When the pixels in the corresponding column dose not display the preset color, existence of a crack region can be determined. Because the detection of the crack region of the film layer by the PCD routing is not the subject of the present application, only the basic principle is described. The more detailed description can be made with reference to related documents, which do not constitute a limitation of the present disclosure.

An organic light emitting diode (OLED) circuit comprises a classic 7T1C is taken as an example, referring to Table 1. When the crack of the film layer is slight, the crack of the TFE thin film is not obvious. At this moment, the resistance changes of the PCD routing 103 and the data line are not obvious (No. 4~9), and the color changes of the pixels in the corresponding column is not obvious. The tester believes that the array substrate is a good product.

TABLE 1

Influence of Crack of Film Layer on Resistance Value of PCD Routing

| Serial number | Crack | PCD screen detection | Resistance ($\Omega$) |
|---|---|---|---|
| 1 | No Crack | Crack not detected | 24.1K |
| 2 | No Crack | Crack not detected | 25.1K |
| 3 | No Crack | Crack not detected | 22.1K |
| 4 | Crack | Crack not detected | 22.2K |
| 5 | Crack | Crack not detected | 42.5K |
| 6 | Crack | Crack not detected | 30.7K |
| 7 | Crack | Crack not detected | 30.1K |
| 8 | Crack | Crack not detected | 22.8K |
| 9 | Crack | Crack not detected | 27.8K |

TABLE 1-continued

Influence of Crack of Film Layer on Resistance Value of PCD Routing

| Serial number | Crack | PCD screen detection | Resistance ($\Omega$) |
|---|---|---|---|
| 10 | Crack | Crack detected | 1871M |
| 11 | Crack | Crack detected | 1035M |
| 12 | Crack | Crack detected | 239.3M |

Under this condition, in the high-temperature reliability test of the OLED product or in the subsequent usage of the OLED product, the progress of the crack of the film layer will lead to a panel to become defective, which may lead to a scrap risk of the panel.

Figure 2:
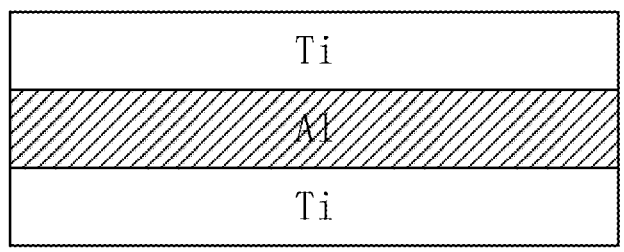
FIG. 2 is a cross-sectional schematic view along direction A-A' in FIG. 1.

Among the technologies known to the inventers, the PCD routing is formed in the same patterning process as a source drain electrode layer in the display region. That is, the PCD routing in the non-display region 102 and the source drain electrode layer in the display region 101 are provided in the same layer. In order to provide a better conductive performance and a better ductile performance, a Ti/Al/Ti structure is generally used for the source drain electrode layer in the display region 101. Accordingly, the Ti/Al/Ti structure is also used in the PCD routing (as shown in FIG. 2). The good ductile performance of the PCD routing can buffer a force that is applied thereon when the crack of the film layer appears, and causes the crack of the PCD routing to be slight under the action of the same force, and therefore the resistance change is small, and the resultant crack is difficult to be detected.

Figure 3A:
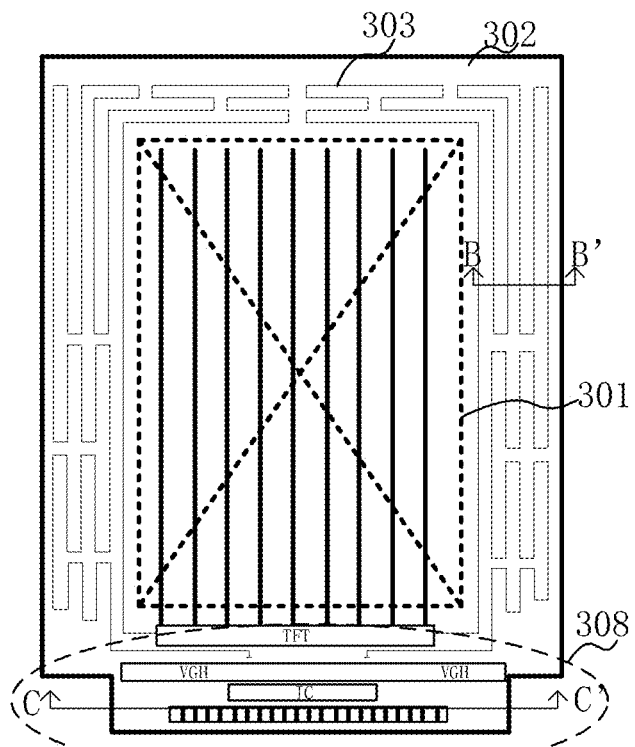
FIG. 3A is a schematic diagram of a detection line routing in a non-display region according to an embodiment of the present disclosure.
Figure 3B:
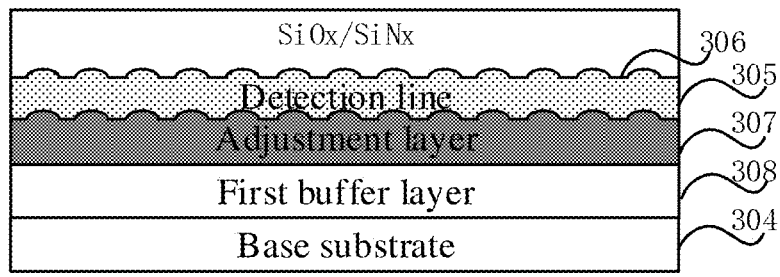
FIG. 3B is a cross-sectional schematic view that is taken along line B-B' in FIG. 3A.
Figure 3C:
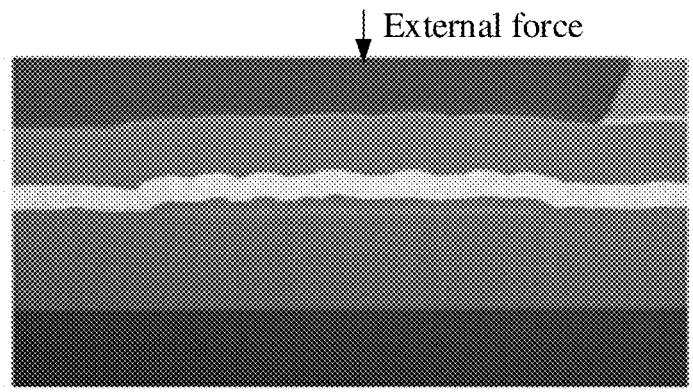
FIG. 3C is a schematic diagram showing a force acting on a cross-sectional view along line B-B' in FIG. 3A.
Figure 3D:
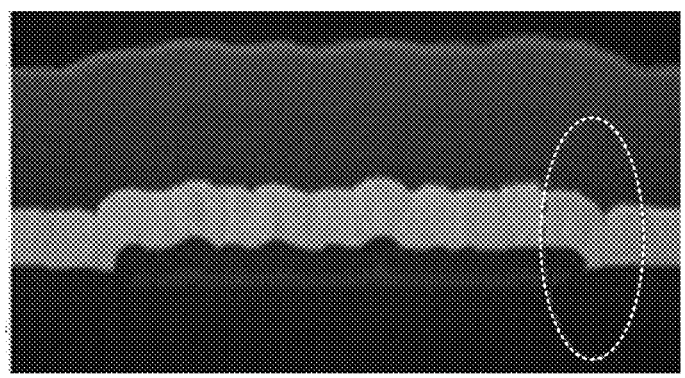
FIG. 3D is a schematic diagram of a crack of a detection line according to an embodiment of the present disclosure.

At least one of the embodiments of the present disclosure provides an array substrate, referring to FIG. 3A, FIG. 3B and FIG. 3C. The array substrate includes a base substrate 304, a display region 301 formed on the base substrate 304 and a non-display region 302 formed on the base substrate 304 around the display region 301. Referring to FIG. 3A and FIG. 3B, the array substrate further includes a detection line 305 that is provided in the non-display region 302. The detection line 305 is provided on the base substrate 304. A surface of the detection line 305 away from the base substrate 304 is provided in an undulating shape 306. Referring to FIG. 3C, FIG. 3C shows a metallographic image along line B-B' on FIG. 3A. Because the surface of detection line 305 is shaped in the undulating shape 306, ductile performances of different parts of the detection line 305 are different. When the detection line is subjected to the action of an external force, referring to FIG. 3D, the part of the detection line, which is located near the external force and of which the ductile performance is weak, is more prone to generate a crack (that is, a region inside a dotted line frame), so that the resistance value of the detection line changes significantly. In other words, in the array substrate according to the embodiments of the present disclosure, the problem of the crack of the TFE caused by the slight crack of the film layer is easier to be detected, which improves the sensitivity of detection on the crack of the film layer and reduces the rate of missed detection.

The undulating shape 306 may be a wave shape, a stepped shape (high steps and low steps are interval arranged), etc. In an embodiment of the present disclosure, the undulating shape 306 is of a wave shape.

In an embodiment of the present disclosure, still referring to FIG. 3B, the array substrate further includes an adjustment layer 307. The adjustment layer 307 is provided on the base substrate 304. The detection line 305 is provided on the adjustment layer 307. In the embodiment, the adjustment layer 307 may be made of polycrystalline silicon (P-Si). Therefore, the adjustment layer 307 may be formed by the same patterning process as an active layer (not shown in the figure) in the display region 301. Referring to FIG. 3B, the surface of the adjustment 307 away from the base substrate 304 is in the undulating shape. Thus, the surface of the detection line 305 away from the base substrate and the surface of the detection line 305 close to the base substrate are both provided in undulating shapes. In the present embodiment, by providing the adjustment layer 307 in an undulating shape, when the detection line 305 is formed on the adjustment 307, the surface of the detection line 305 away from the base substrate 304 and the surface of the detection line 305 close to the base substrate 304 may be both in the undulating shape.

In an embodiment of the present disclosure, still referring to FIG. 3B, the array substrate further include a first buffer layer 308. The first buffer layer 308 may be provided between the adjustment layer 307 and the base substrate 304. The first buffer layer 308 may be formed by the same patterning process as a second buffer layer (not shown in the figure) in the display region 304. Thus, the first buffer layer 308 may increase an adhesive force between the adjustment layer 307 and the base substrate 304 to prevent the adjustment layer 307 from falling off.

It should be understood that, because the detection line 305 is in the configuration of the undulating shape, even if the detection line 305 is still formed of the Ti/Al/Ti structure, the sensitivity of the detection of the crack of the film layer can be similarly improved.

In order to further improve the sensitivity of the detection, in an embodiment of the present disclosure, the detection line 305 is made of metal molybdenum. Under this condition, the detection line 305 is formed by the same patterning process as a gate electrode layer (not shown in the figure) in the display region 301 or the pixel electrode layer in the display region 301.

In an embodiment of the present disclosure, the detection line 305 is formed by the same patterning process as the gate layer in the display region 301. As shown in FIG. 4(a) to FIG. 4(e), the process of forming the detection line 305 includes following steps.

Figure 4:
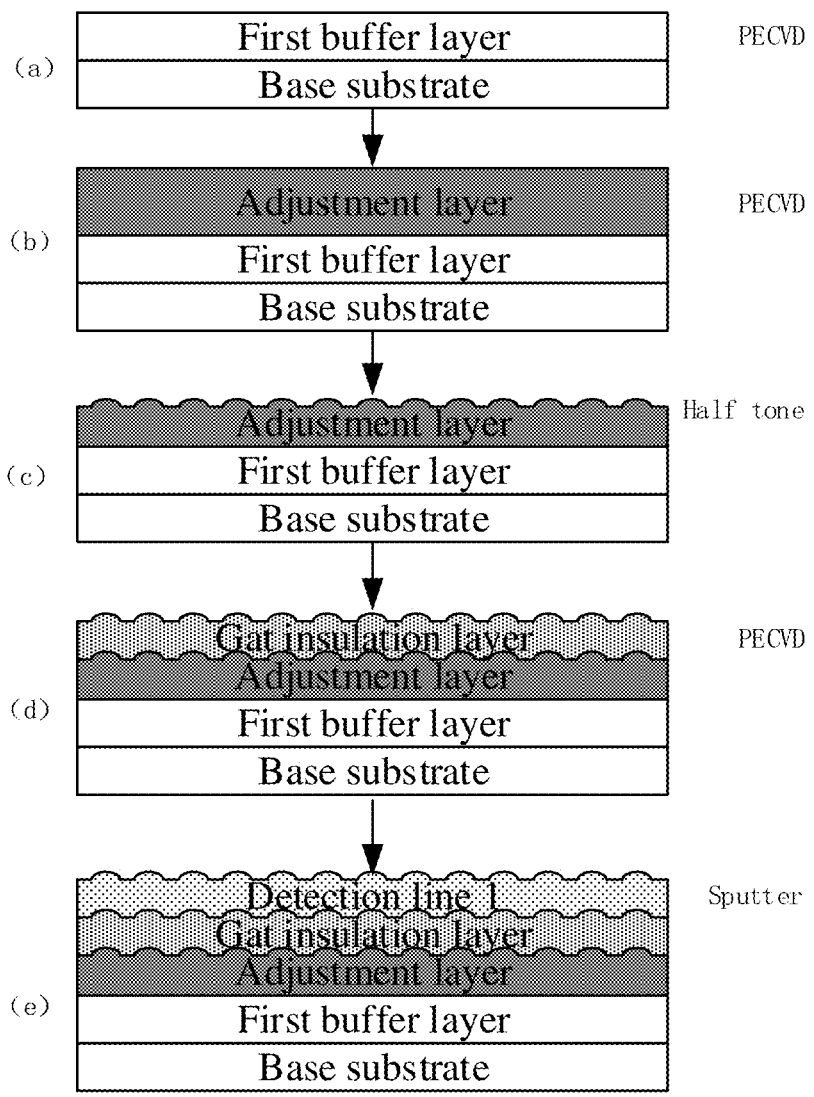
FIG. 4 is a process flowchart of forming a detection line and a gate electrode layer in a display region by a same patterning process according to an embodiment of the present disclosure.

In step one, referring to FIG. 4(a), a first buffer layer is formed on a base substrate by a plasma enhanced chemical vapor deposition (PECVD) method. The first buffer layer is formed by the same patterning process as a second buffer layer in a display region. In the embodiment, the base substrate may be made of polyester fiber or other materials. The first buffer layer and the second buffer layer may be made of silicon oxide ($SiO_x$) and/or silicon nitride ($SiN_x$) materials.

In step two, referring to FIG. 4(b), an adjustment layer is formed on the first buffer layer by a PECVD method. The adjustment layer is formed by the same patterning process as an active layer in the display region. In the embodiment, the adjustment may be made of polycrystalline silicon (P-Si).

Figure 5:
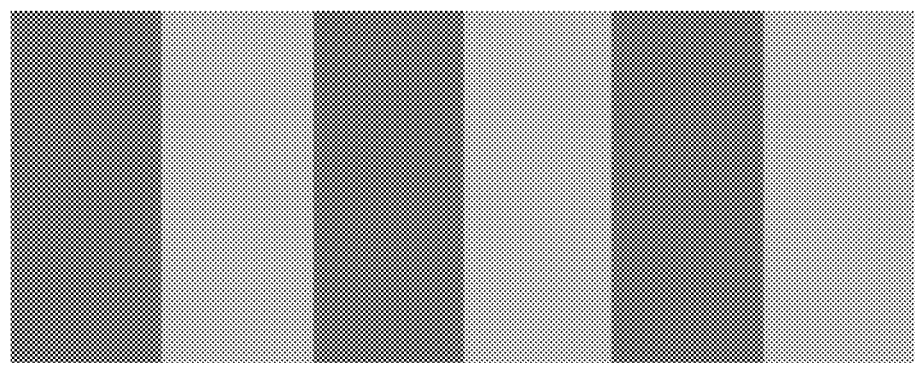
FIG. 5 is a schematic diagram of a mask plate in a detection line region according to an embodiment of the present disclosure.

In step three, referring to FIG. 4(c), a surface of the adjustment layer away from the base substrate is formed in an undulating shape. For example, with a halftone process, when an active layer (ACT) mask process is performed, partial exposure is alternatively performed in a detection line region in the non-display region, and resultant patterns are shown in FIG. 5. When an ACT dry etch process is performed, due to the halftone process, the surface of the P-Si is formed in the undulating shape with concave portions and convex portions.

In step four, referring to FIG. 4(d), a gate insulation layer is formed on the adjustment layer by a PECVD method. The gate insulation layer is formed by the same patterning process as the gate insulation layer in the display region. In the embodiment, the gate insulation layer may be made of silicon oxide ($SiO_x$) and/or silicon nitride ($SiN_x$) materials.

In step five, referring to FIG. 4(e), a detection line is formed on the gate insulation layer by a sputtering method. Under this condition, the bottom part of the detection line (that is, a surface close to the base substrate) is formed in the undulating shape with concave portions and convex portions.

In an embodiment of the present disclosure, the detection line 305 is formed by the same patterning process as a pixel electrode layer in the display region 301. The difference between the embodiment that the detection line 305 is formed by the same patterning process as the pixel electrode layer in the display region 301 and the embodiment that the detection line 305 is formed by the same patterning process as the gate electrode layer in the display region 301 is as follows.

In step five, the detection line 2 is formed on the gate insulation layer by a sputtering method, which is in correspondence with the patterning process of the pixel electrode layer in the display region. The detection line 305 that is formed by the same patterning process as the gate electrode layer in the display region 301 can be implemented with reference to the embodiment that the detection line 305 is formed by the same patterning process as the gate electrode layer, which will not be repeated here.

Figure 6:
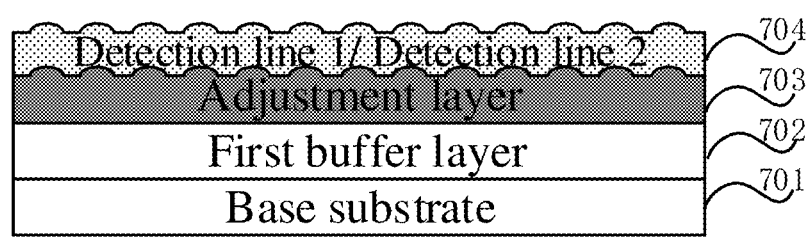
FIG. 6 is a cross-sectional schematic view taken along line C-C' in FIG. 2.

In another embodiment of the present disclosure, still referring to FIG. 3A, the array substrate further includes a fan-out region 308. Referring to FIG. 6, the fan-out region 308 includes a base substrate 701, a first buffer layer 702, an adjustment layer 703 and a detection line 704. In the embodiment, the first buffer layer 702 may be formed by the same patterning process as the gate insulation layer in the display region. The adjustment layer 703 may be formed by the same patterning process as the active layer in the display region. The first buffer layer 702 is provided on the base substrate 701. The adjustment layer 703 is provided on the first buffer layer 702, and the surface of the adjustment layer 703 away from the base substrate 701 is in the undulating shape. Correspondingly, the surface of the detection line 704 away from the first buffer layer 702 and the surface of the detection line 704 close to the first buffer layer 702 are provided in undulating states. The process of forming the fan-out region includes following processes.

In a pad bending process, the active layer in the non-display region is formed with a hole by adding an edge bending A (EBA) mask process. That is, the halftone process is performed in the EBA mask process. The formed patterns are shown in FIG. 5. The surface of the active layer away from the base substrate is formed in the undulating shape, thereby making the bottom part of the detection line 704 has an effect of the undulating shape with concave portions and convex portions.

It should be understood, the detection line 704 may further be formed by the same patterning process as the pixel electrode layer in the display region. Correspondingly, the adjustment layer 703 may be formed by the same patterning process as an interlayer dielectric layer ILD (dielectric material between pixel electrodes). Manufacturing processes can be referred to the embodiment that the adjustment layer 703 is in correspondence with the active layer in the display region, which will not be repeated here.

It should be noted that, a thin film transistor in the display region of the array substrate in the present embodiment is in a top gate structure, with which the detection line routing in the display region is in correspondence. Of course, when the structure of the TFT transistor is changed, the detection line routing in the display region can be changed accordingly.

At least one embodiment of the present disclosure further provides a display panel which includes an array substrate. In the embodiment, the array substrate is above mentioned array substrate. The display panel may be configured to display devices such as mobile phones, computers, tablets, televisions, etc.

In the present disclosure, terms "first" and "second" are used for descriptive purposes only, and cannot to be understood as indicating or implying relative importance. A term "plurality" refers to two or more, unless otherwise specifically defined. In the present disclosure, two components connected by a dashed line are in electrical connection relationship or contact relationship, and the dashed line is only used to make the accompanying drawings clearer, and the solution of the embodiments of the present disclosure is more easily understood.

What are described above is related to the illustrative embodiments of the disclosure only and not limitative to the scope of the disclosure; the scopes of the disclosure are defined by the accompanying claims.

What is claimed is:

1. An array substrate, comprising:
   a base substrate;
   a display region, formed on the base substrate; and
   a non-display region, formed on the base substrate around the display region,
   wherein the non-display region comprises a detection line that is provided on the base substrate, and a surface of the detection line away from the base substrate is in a first undulating shape in a width direction perpendicular to an extending direction of the detection line;
   wherein the non-display region further comprises an adjustment layer, and the display region comprises an active layer;
   the adjustment layer is provided on the base substrate, the adjustment layer is in a same layer as the active layer in the display region, and the adjustment layer has a same material as the active layer in the display region;
   the detection line is provided on the adjustment layer;
   a surface of the adjustment layer away from the base substrate is in a second undulating shape in the width direction perpendicular to the extending direction of the detection line, and the surface of the detection line away from the base substrate and a surface of the detection line close to the base substrate are both in the first undulating shape;
   wherein the non-display region further comprises a first buffer layer, and the display region further comprises a second buffer layer;
   the first buffer layer is provided between the adjustment layer and the base substrate, and the first buffer layer is in a same layer as the second buffer layer in the display region;
   wherein the display region comprises a gate electrode layer, and the detection line is in a same layer as the gate electrode layer in the display region; and
   wherein the detection line is made of metal molybdenum.

2. The array substrate according to claim 1, wherein the display region comprises a pixel electrode, and the detection line is in a same layer as the pixel electrode layer in the display region.

3. The array substrate according to claim 1, further comprising a fan-out region,
   wherein the fan-out region comprises the base substrate, a first buffer layer, an adjustment layer and the detection line;
   the first buffer layer is provided on the base substrate, the adjustment layer is provided on the first buffer layer, and the surface of the adjustment layer away from the base substrate is in a second undulating shape in the width direction perpendicular to the extending direction of the detection line, and the surface of the detection line away from the base substrate and a surface of the detection line close to the base substrate are both in the first undulating shape.

4. The array substrate according to claim 1, wherein the first undulating shape is a wave shape.

5. A display device, comprising the array substrate according to claim 1.

* * * * *